United States Patent
Shimada et al.

(10) Patent No.: US 12,389,135 B2
(45) Date of Patent: Aug. 12, 2025

(54) SIGNAL PROCESSING CIRCUIT

(71) Applicant: HAMAMATSU PHOTONICS K.K., Hamamatsu (JP)

(72) Inventors: Akihiro Shimada, Hamamatsu (JP); Mitsuhito Mase, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 5 days.

(21) Appl. No.: 18/580,736

(22) PCT Filed: May 11, 2022

(86) PCT No.: PCT/JP2022/019943
§ 371 (c)(1),
(2) Date: Jan. 19, 2024

(87) PCT Pub. No.: WO2023/021796
PCT Pub. Date: Feb. 23, 2023

(65) Prior Publication Data
US 2024/0429916 A1   Dec. 26, 2024

(30) Foreign Application Priority Data

Aug. 19, 2021 (JP) ................................. 2021-133947

(51) Int. Cl.
*H03K 17/687* (2006.01)
*H03H 11/04* (2006.01)
(Continued)

(52) U.S. Cl.
CPC ........... *H04N 25/618* (2023.01); *H03H 11/04* (2013.01); *H03K 17/687* (2013.01); *H04N 25/62* (2023.01)

(58) Field of Classification Search
CPC ...... H03H 11/04; H03K 17/687; H04N 25/60; H04N 25/618; H04N 25/62
(Continued)

(56) References Cited

U.S. PATENT DOCUMENTS 5,736,896 A * 4/1998 Sakishita .............. G01L 23/225
   327/554
2001/0030699 A1* 10/2001 Sakuragi ................ H04N 25/78
   348/E3.018
(Continued)

FOREIGN PATENT DOCUMENTS

JP    H5-304471 A    11/1993
JP    2011-124894 A    6/2011
(Continued)

OTHER PUBLICATIONS

International Preliminary Report on Patentability mailed Feb. 29, 2024 for PCT/JP2022/019943.
(Continued)

*Primary Examiner* — William Hernandez
(74) *Attorney, Agent, or Firm* — Faegre Drinker Biddle & Reath LLP

(57) ABSTRACT

A signal processing circuit includes: a filter circuit that removes noise from a target signal; and a controller that controls the filter circuit. The filter circuit includes: a CMOS switch including a first MOSFET and a second MOSFET having different channel types and connected in parallel; and a capacitor electrically connected between an output of the CMOS switch and a ground potential. The controller switches a state of the CMOS switch between a first state in which the first MOSFET is in an ON state and a second state in which the first MOSFET is in an OFF state and the second
(Continued)

MOSFET is in an ON state. An ON resistance value of the second MOSFET is higher than an ON resistance value of the first MOSFET.

10 Claims, 13 Drawing Sheets

(51) Int. Cl.
  *H04N 25/618* (2023.01)
  *H04N 25/62* (2023.01)
(58) Field of Classification Search
  USPC .................................... 327/100, 551, 552
  See application file for complete search history.

(56) References Cited

U.S. PATENT DOCUMENTS

2005/0098725 A1    5/2005  Yamaguchi
2012/0320246 A1   12/2012  Ikuma et al.

FOREIGN PATENT DOCUMENTS

JP      2015-198263 A    11/2015
JP      2015-213258 A    11/2015

OTHER PUBLICATIONS

Extended European Search Report issued on Feb. 14, 2025 in corresponding European patent application 22858120.3 (10 pages).

\* cited by examiner

SIGNAL PROCESSING CIRCUIT

TECHNICAL FIELD

The present disclosure relates to a signal processing circuit.

BACKGROUND ART

In an imaging device, a low-pass filter may be provided to reduce noise in a pixel circuit. For example, Patent Document 1 describes an imaging device including a low-pass filter including a resistor element, a switch provided in parallel with the resistor element, and a sample-hold circuit, and a control circuit for switching the switch. In the imaging device, in order to shorten the time required for sampling, the time constant of the low-pass filter is increased by switching the switch from the ON state to the OFF state during sampling by the sample-hold circuit.

CITATION LIST

Patent Literature

Patent Document 1: Japanese Patent Application Laid-Open Publication No. 2015-198263

SUMMARY OF INVENTION

Technical Problem

In order to realize a cut-off frequency at which noise can be sufficiently removed, the size of the resistor element is increased. For example, in the imaging device described in Patent Document 1, the size of the resistor element is larger than the pitch between pixels. Therefore, there is a demand for a circuit configuration capable of switching the time constant of the filter circuit while reducing the circuit scale.

The present disclosure describes a signal processing circuit capable of switching a time constant of a filter circuit while reducing the circuit scale.

Solution to Problem

A signal processing circuit according to one aspect of the present disclosure includes: a filter circuit that removes noise from a target signal; and a controller that controls the filter circuit. The filter circuit includes: a CMOS switch including a first MOSFET and a second MOSFET having different channel types and connected in parallel; and a capacitor electrically connected between an output of the CMOS switch and a ground potential. The controller switches a state of the CMOS switch between a first state in which the first MOSFET is in an ON state and a second state in which the first MOSFET is in an OFF state and the second MOSFET is in an ON state. An ON resistance value of the second MOSFET is higher than an ON resistance value of the first MOSFET.

In the signal processing circuit, a low-pass filter is constituted by the CMOS switch and the capacitor. Since the ON resistance value of the second MOSFET is higher than the ON resistance value of the first MOSFET, the resistance value of the CMOS switch in the second state is higher than the resistance value of the CMOS switch in the first state. Therefore, switching the time constant of the filter circuit can be realized by switching the state of the CMOS switch between the first state and the second state. As a result, since the resistor element can be omitted, the time constant of the filter circuit can be switched while the circuit scale is reduced.

The controller may switch the state of the CMOS switch from the first state to the second state while the capacitor is being charged by the target signal. In this case, while the capacitor is being charged by the target signal, the time constant of the filter circuit is switched from a small value to a large value. Therefore, the settling time can be shortened while removing noise from the target signal.

The signal processing circuit may further include: a light receiving element that generates and accumulates electric charge by being irradiated with light; and an amplifier circuit that amplifies an output signal of the filter circuit. The filter circuit may receive, as the target signal, a signal corresponding to the electric charge accumulated by the light receiving element. In this case, the filter circuit is provided between the light receiving element and the amplifier circuit. Therefore, since the noise included in the target signal is removed by the filter circuit before being amplified by the amplifier circuit, the noise can be effectively removed.

The signal processing circuit may further include: a light receiving element that generates and accumulates electric charge by being irradiated with light; and an amplifier circuit that generates the target signal by amplifying a signal corresponding to the electric charge accumulated by the light receiving element, and supplies the target signal to the filter circuit. In this case, the filter circuit is provided in an output stage of the amplifier circuit. Therefore, the filter circuit can be driven by the amplifier circuit.

The amplifier circuit may include a setting circuit that sets a reset level of the target signal. The resistance value of the first MOSFET and the resistance value of the second MOSFET can vary in accordance with the input voltage (voltage value of the target signal) of the CMOS switch. Therefore, by appropriately setting the reset level, the resistance value of the CMOS switch in the first state and the resistance value of the CMOS switch in the second state can be set to desired values.

The signal processing circuit may further include a setting circuit that sets a reset level of the target signal. The resistance value of the first MOSFET and the resistance value of the second MOSFET can vary in accordance with the input voltage (voltage value of the target signal) of the CMOS switch. Therefore, by appropriately setting the reset level, the resistance value of the CMOS switch in the first state and the resistance value of the CMOS switch in the second state can be set to desired values.

The setting circuit may set the reset level so that a voltage of the target signal varies within a range in which the ON resistance value of the second MOSFET is higher than the ON resistance value of the first MOSFET. In this case, since the magnitude relationship between the resistance value of the CMOS switch in the first state and the resistance value of the CMOS switch in the second state is determined, switching of the time constant of the filter circuit can be surely realized.

The first state may be a state in which both the first MOSFET and the second MOSFET are in an ON state. In this case, the resistance value of the CMOS switch in the first state is lower than the resistance value of the CMOS switch when only the first MOSFET is in the ON state. This makes it possible to further reduce the time constant of the filter circuit when the CMOS switch is in the first state.

The first MOSFET may be a p-channel MOSFET. The second MOSFET may be an n-channel MOSFET. As the input voltage of the CMOS switch increases, the resistance value of the p-channel MOSFET tends to decrease and the resistance value of the n-channel MOSFET tends to increase. Therefore, when the input voltage of the CMOS switch is a high voltage, switching of the time constant of the filter circuit can be realized more reliably.

The first MOSFET may be an n-channel MOSFET. The second MOSFET may be a p-channel MOSFET. In this configuration, when the input voltage of the CMOS switch is a low voltage, switching of the time constant of the filter circuit can be realized more reliably.

Advantageous Effects of Invention

According to the present disclosure, the time constant of the filter circuit can be switched while reducing the circuit scale.

DESCRIPTION OF EMBODIMENTS

Figure 1:
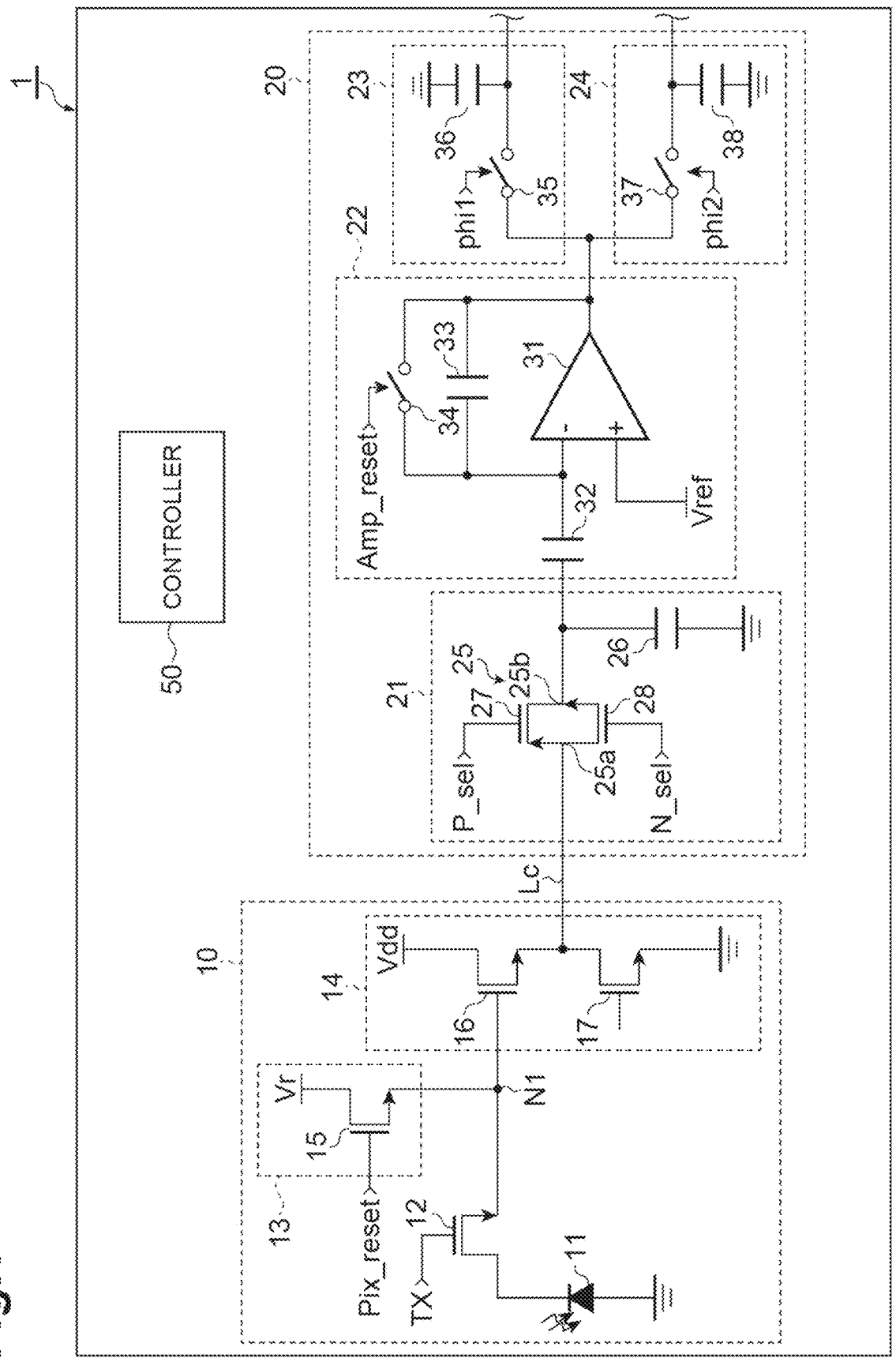
FIG. 1 is a diagram showing a circuit configuration of a signal processing circuit according to a first embodiment.

Hereinafter, embodiments of the present disclosure will be described with reference to the drawings. In the description of the drawings, the same elements are denoted by the same reference numerals, and redundant description will be omitted.

First Embodiment

Figure 2:
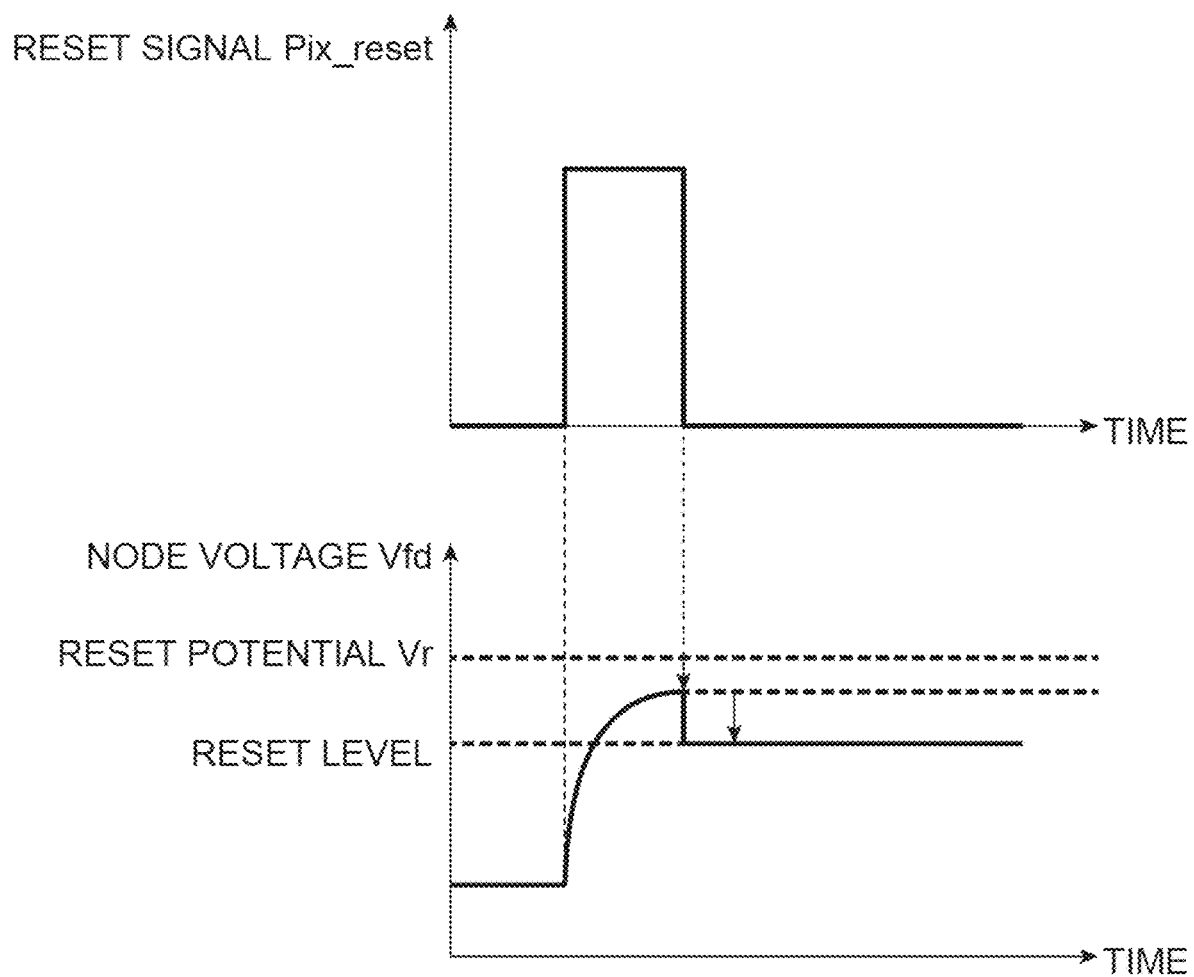
FIG. 2 is a diagram for explaining a reset level set by the setting circuit shown in FIG. 1.
Figure 3:
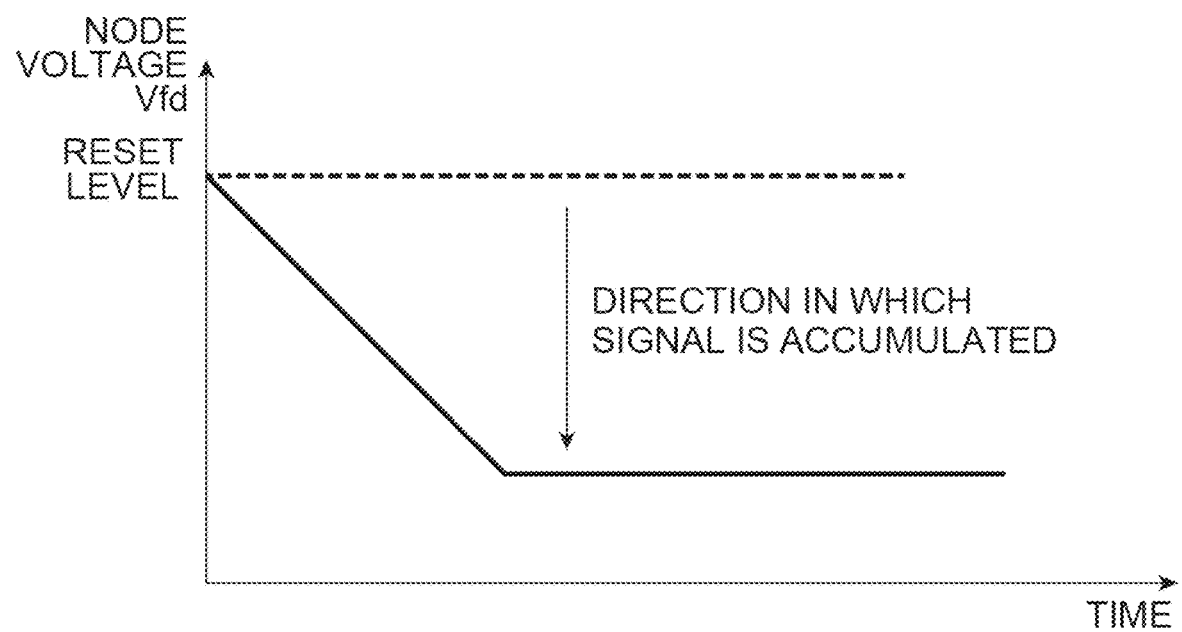
FIG. 3 is a diagram for explaining the voltage of the floating diffusion node shown in FIG. 1.
Figure 4:
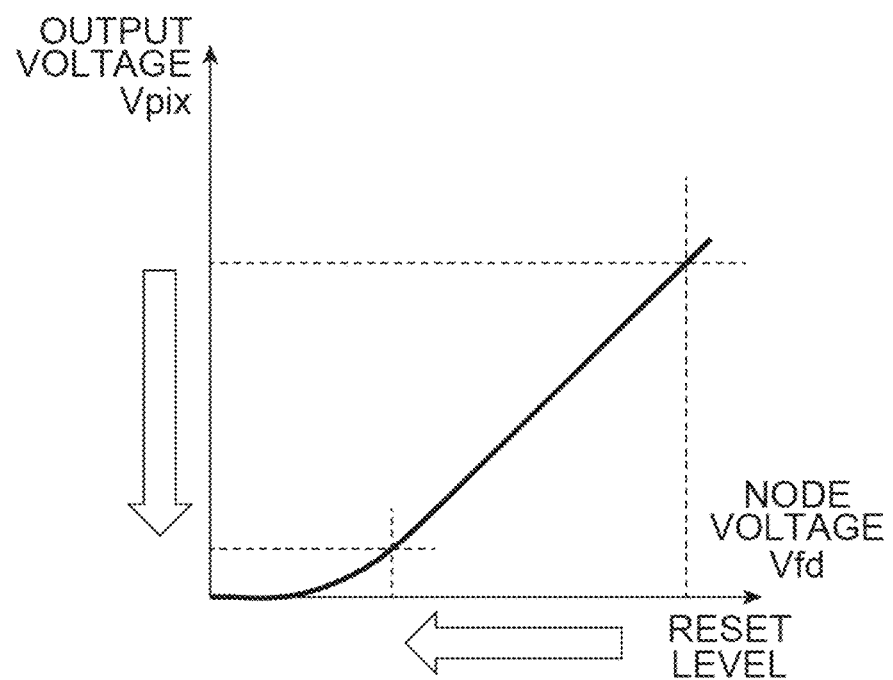
FIG. 4 is a diagram showing input/output characteristics of the source follower circuit shown in FIG. 1.
Figure 5:
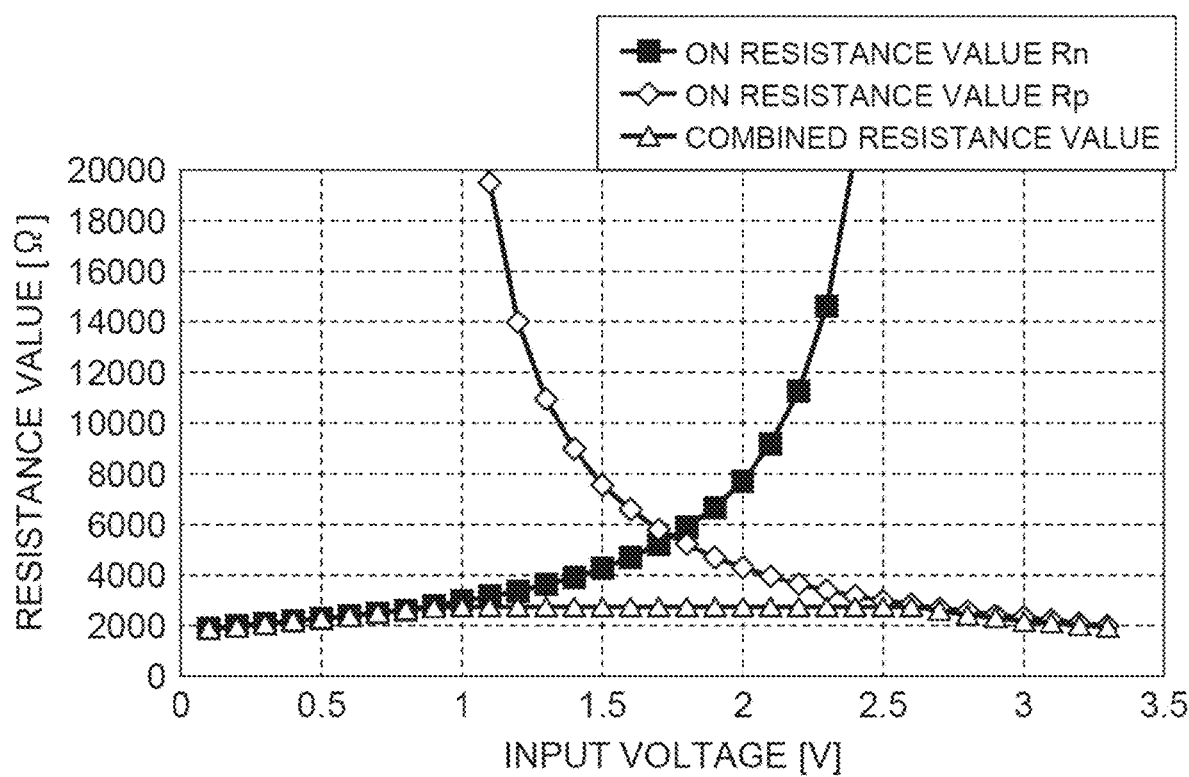
FIG. 5 is a diagram for explaining a resistance value of the CMOS switch shown in FIG. 1.

A configuration of a signal processing circuit according to a first embodiment will be described with reference to FIGS. 1 to 5. FIG. 1 is a diagram showing a circuit configuration of a signal processing circuit according to a first embodiment. FIG. 2 is a diagram for explaining a reset level set by the setting circuit shown in FIG. 1. FIG. 3 is a diagram for explaining the voltage of the floating diffusion node shown in FIG. 1. FIG. 4 is a diagram showing input/output characteristics of the source follower circuit shown in FIG. 1. FIG. 5 is a diagram for explaining a resistance value of the complementary metal oxide semiconductor (CMOS) switch shown in FIG. 1.

A signal processing circuit 1 shown in FIG. 1 is applied to an imaging device. The imaging device may be used under low illumination. An example of the imaging device is an imaging device for Raman spectroscopy. The signal processing circuit 1 includes a pixel circuit 10, a column circuit 20, and a controller 50. Although the imaging device includes a two-dimensional array of pixels arranged in M rows and N columns, a description will be made using a circuit configuration of the signal processing circuit 1 focusing on one pixel. M and N are integers of 2 or more.

The pixel circuit 10 is a circuit for generating an output voltage Vpix in accordance with the amount of light irradiation. The pixel circuit 10 corresponds to one pixel included in the pixel array. The pixel circuit 10 includes a light receiving element 11, a transistor 12, a setting circuit 13, and a source follower circuit 14.

The light receiving element 11 is an element that generates electric charge when irradiated with light. An example of the light receiving element 11 is a photodiode. An anode of the light receiving element 11 is electrically connected to the ground potential. The electric charge generated in the light receiving element 11 is accumulated in a parasitic capacitor (not shown). It should be noted that the term "electrically connected" between two circuit elements may include not only that the two circuit elements are directly connected to each other by wiring or the like, but also that the two circuit elements are indirectly connected to each other via another circuit element.

The transistor 12 is a circuit element for transferring electric charge accumulated by the light receiving element 11. The transistor 12 is, for example, an n-channel metal oxide semiconductor field effect transistor (MOSFET). A drain of the transistor 12 is electrically connected to a cathode of the light receiving element 11. A source of the transistor 12 is electrically connected to a node N1. The node N1 is a floating diffusion node. A transfer signal TX is supplied to a gate of the transistor 12. When the high-level transfer signal TX is supplied to the gate of the transistor 12, the transistor 12 is turned on, and then the electric charge accumulated in the light receiving element 11 are output from the source of the transistor 12.

The setting circuit 13 is a circuit for setting a reset level of the output voltage Vpix. The setting circuit 13 sets the reset level of the output voltage Vpix by setting a reset level of the node voltage Vfd. The node voltage Vfd is a voltage of the node N1. The setting circuit 13 includes a transistor 15. The transistor 15 is, for example, an n-channel MOSFET. A drain of the transistor 15 is set to a reset potential Vr. A source of the transistor 15 is electrically connected to the node N1. A reset signal Pix_reset is supplied to a gate of the transistor 15. By supplying a high-level pulse-like reset signal Pix_reset to the gate of the transistor 15, the reset operation of the node voltage Vfd is performed while the reset signal Pix_reset is at a high level (reset period). In the reset operation, the transistor 15 is turned on and the node voltage Vfd is set to the reset level.

As shown in FIG. 2, the reset level of the node voltage Vfd is lower than the reset potential Vr. More specifically, when the transistor 15 is turned on, the source voltage (i.e., the node voltage Vfd) of the transistor 15 increases, so that the gate-source voltage Vgs of the transistor 15 decreases. Then, before the drain-source voltage Vds of the transistor 15 becomes 0, the gate-source voltage Vgs of the transistor 15 becomes lower than the threshold voltage Vthn of the transistor 15. Therefore, the reset current (=β×(Vgs−Vthn)× Vds) becomes 0. The gain coefficient β is a value depending on the process of the transistor 15.

That is, the fluctuation of the node voltage Vfd is stopped before the source voltage of the transistor 15 becomes equal to the drain voltage (i.e., the reset potential Vr) of the transistor 15. As a result, the node voltage Vfd changes to the potential obtained by subtracting the threshold voltage Vthn from the reset potential Vr during the reset period. Further, when the reset period ends and the transistor 15 is switched from the ON state to the OFF state, the node voltage Vfd is further lowered by the influence of the clock feed-through component and the charge-injection. As described above, the node voltage Vfd is set to the reset level.

As shown in FIG. 3, when the transistor 12 is in the ON state, the node voltage Vfd decreases from the reset level as the amount of accumulated electric charge increases.

The source follower circuit 14 is a circuit for generating the output voltage Vpix by amplifying the node voltage Vfd. The source follower circuit 14 includes a transistor 16 and a transistor 17. The transistors 16 and 17 are, for example, n-channel MOSFETs. A drain of the transistor 16 is electrically connected to a power supply line for supplying a power supply voltage Vdd. A gate of the transistor 16 is electrically connected to the node N1. A source of the transistor 16 and a drain of the transistor 17 are electrically connected to each other and electrically connected to a column signal line Lc. A source of the transistor 17 is electrically connected to the ground potential. A bias voltage is supplied to a gate of the transistor 17. The transistor 17 functions as a load transistor. The node voltage Vfd supplied to the gate of the transistor 16 is amplified, and the output voltage Vpix is output from the source of the transistor 16 to the column signal line Lc.

The source follower circuit 14 has the input/output characteristics shown in FIG. 4. In FIG. 4, the horizontal axis represents an input voltage (node voltage Vfd), and the vertical axis represents an output voltage Vpix. The node voltage Vfd is input as an input voltage to the source follower circuit 14. As described above, the node voltage Vfd decreases from the reset level in accordance with the amount of accumulated electric charge. In a range in which the node voltage Vfd varies, the input voltage and the output voltage of the source follower circuit 14 are directly proportional to each other. In other words, the output voltage Vpix is obtained by multiplying the node voltage Vfd by a predetermined amplification factor. As the node voltage Vfd decreases, the output voltage Vpix also decreases. In other words, the output voltage Vpix is a signal corresponding to the electric charge accumulated by the light receiving element 11.

The pixel circuit 10 may further include a row selection transistor provided between the source of the transistor 16 and the column signal line Lc.

The column circuit 20 is a circuit which receives a target signal (output voltage Vpix) from the pixel circuit 10 and performs amplification and noise removal of the target signal. The column circuit 20 is provided for each column of the pixel array. That is, the M pixel circuits 10 belonging to the same column are commonly connected to one column circuit 20 via the same column signal line Lc. The column circuit 20 includes a filter circuit 21, an amplifier circuit 22, a sample-hold circuit 23, and a sample-hold circuit 24.

The filter circuit 21 is a circuit for removing noise from the target signal. In the present embodiment, the output voltage Vpix is received from the pixel circuit 10 as the target signal. The filter circuit 21 constitutes a low-pass filter. The filter circuit 21 includes a CMOS switch 25 and a capacitor 26. The CMOS switch 25 has a terminal 25a and a terminal 25b. The terminal 25a is electrically connected to the column signal line Lc. The terminal 25b is electrically connected to one end of the capacitor 26 and is also electrically connected to the amplifier circuit 22 in the output stage of the filter circuit 21. The CMOS switch 25 includes a transistor 27 (first MOSFET) and a transistor 28 (second MOSFET).

The transistor 27 and the transistor 28 are MOSFETs having different channel types. In the present embodiment, the transistor 27 is a p-channel MOSFET, and the transistor 28 is an n-channel MOSFET. The transistors 27 and 28 are connected in parallel. Specifically, a source of the transistor 27 and a drain of the transistor 28 are electrically connected to each other and electrically connected to the terminal 25a. A drain of the transistor 27 and a source of the transistor 28 are electrically connected to each other and electrically connected to the terminal 25b.

A selection signal P_sel is supplied to a gate of the transistor 27. A selection signal N_sel is supplied to a gate of the transistor 28. When a low-level selection signal P_sel is supplied to the gate of the transistor 27, the transistor 27 is turned on. When a high-level selection signal P_sel is supplied to the gate of the transistor 27, the transistor 27 is turned off. When a high-level selection signal N_sel is supplied to the gate of the transistor 28, the transistor 28 is turned on. When a low-level selection signal N_sel is supplied to the gate of the transistor 28, the transistor 28 is turned off.

The ON resistance value Rp of the transistor 27 and the ON resistance value Rn of the transistor 28 have the characteristics shown in FIG. 5. In FIG. 5, the horizontal axis represents an input voltage (unit: V), and the vertical axis represents a resistance value (unit: Ω). As shown in FIG. 5, the ON resistance value Rp and the ON resistance value Rn vary in accordance with the input voltage Vin of the CMOS switch 25. As the input voltage Vin increases, the ON resistance value Rp decreases. On the other hand, as the input voltage Vin increases, the ON resistance value Rn increases.

Specifically, up to the input voltage Vin of about 1.7 V, the ON resistance value Rp rapidly decreases as the input voltage Vin increases. When the input voltage Vin exceeds 1.7 V, the ON resistance value Rp gradually decreases as the input voltage Vin increases. Up to the input voltage Vin of about 1.7 V, the ON resistance value Rn gradually increases as the input voltage Vin increases. When the input voltage Vin exceeds 1.7 V, the ON resistance value Rn rapidly increases as the input voltage Vin increases. The combined resistance value of the ON resistance value Rp and the ON resistance value Rn is substantially constant (about 2000Ω) regardless of the input voltage Vin.

When both the transistor 27 and the transistor 28 are in the OFF state, the CMOS switch 25 is in a cut-off state. The cut-off state is a state in which the terminal 25a and the terminal 25b are electrically isolated from each other. When at least one of the transistor 27 and the transistor 28 is in the ON state, the CMOS switch 25 is in a conductive state. The conductive state is a state in which the terminal 25a and the terminal 25b are electrically connected to each other. The resistance value Rc of the CMOS switch 25 in the conductive state changes according to the states of the transistor 27 and the transistor 28. When the transistor 27 is in the ON state and the transistor 28 is in the OFF state, the resistance value Rc is the ON resistance value Rp. When the transistor 27 is in the OFF state and the transistor 28 is in the ON state, the resistance value Rc is the ON resistance value Rn. When both the transistor 27 and the transistor 28 are in the ON state, the resistance value Rc is a combined resistance value of the ON resistance value Rp and the ON resistance value Rn.

In the present embodiment, the CMOS switch 25 is used in a conductive state, and is switched between a state in which the resistance value Rc is low (low resistance state; first state) and a state in which the resistance value Rc is high (high resistance state; second state). In the present embodiment, the input voltage Vin is the output voltage Vpix. The lower limit value of the variation range of the input voltage Vin is higher than a voltage (about 1.7 V in the example shown in FIG. 5) at which the ON resistance value Rn and the ON resistance value Rp have the same resistance value. In the variation range, the ON resistance value Rn is higher than the ON resistance value Rp, and the combined resistance value of the ON resistance value Rp and the ON resistance value Rn is lower than each of the ON resistance value Rp and the ON resistance value Rn. Therefore, the low resistance state is realized by setting both the transistor 27 and the transistor 28 to the ON state. The high resistance state is realized by setting the transistor 27 to the OFF state and the transistor 28 to the ON state. The reset potential Vr is set so that the variation range of the input voltage Vin is the same as the above-described range. In other words, the setting circuit 13 sets the reset level of the output voltage Vpix so that the output voltage Vpix varies within a range in which the ON resistance value Rn is higher than the ON resistance value Rp.

The capacitor 26 is electrically connected between the terminal 25b of the CMOS switch 25 and the ground potential. The time constant of the filter circuit 21 is a product of the resistance value Rc and the capacitance value of the capacitor 26.

The amplifier circuit 22 is a circuit for amplifying an output signal of the filter circuit 21. The amplifier circuit 22 includes an amplifier 31, a capacitor 32, a capacitor 33, and a switch 34. The amplifier 31 has an inverting input terminal, a non-inverting input terminal, and an output terminal. The non-inverting input terminal of the amplifier 31 is set to a reference potential Vref. The inverting input terminal of the amplifier 31 is electrically connected to an output of the filter circuit 21 via the capacitor 32.

The capacitor 33 is electrically connected between the inverting input terminal and the output terminal of the amplifier 31. The switch 34 is electrically connected between the inverting input terminal and the output terminal of the amplifier 31. The switch 34 is switched between an ON state and an OFF state by a reset signal Amp_reset. When a high-level reset signal Amp_reset is supplied to the switch 34, the switch 34 is turned on. When a low-level reset signal Amp_reset is supplied to the switch 34, the switch 34 is turned off. The amplification factor (gain) of the amplifier circuit 22 is obtained by dividing the capacitance value of the capacitor 32 by the capacitance value of the capacitor 33.

The sample-hold circuit 23 is a circuit for holding a reset level of an output signal of the amplifier circuit 22. The sample-hold circuit 23 includes a switch 35 and a capacitor 36. One end of the capacitor 36 is electrically connected to the output terminal of the amplifier 31 via the switch 35. The other end of the capacitor 36 is electrically connected to the ground potential. The switch 35 is switched between an ON state and an OFF state by a switching signal phi1. When a high-level switching signal phi1 is supplied to the switch 35, the switch 35 is turned on. When a low-level switching signal phi1 is supplied to the switch 35, the switch 35 is turned off. When the switch 35 is in the ON state, the capacitor 36 is charged by the output signal of the amplifier circuit 22.

The sample-hold circuit 24 is a circuit for holding the output signal of the amplifier circuit 22. The sample-hold circuit 24 includes a switch 37 and a capacitor 38. One end of the capacitor 38 is electrically connected to the output terminal of the amplifier 31 via the switch 37. The other end of the capacitor 38 is electrically connected to the ground potential. The switch 37 is switched between an ON state and an OFF state by a switching signal phi2. When a high-level switching signal phi2 is supplied to the switch 37, the switch 37 is turned on. When a low-level switching signal phi2 is supplied to the switch 37, the switch 37 is turned off. When the switch 37 is in the ON state, the capacitor 38 is charged by the output signal of the amplifier circuit 22. The capacitance value of the capacitor 36 is equal to the capacitance value of the capacitor 38.

The controller 50 is a circuit (circuitry) for integrally controlling the signal processing circuit 1. The controller 50 is a computer device including hardware such as a processor and a memory, for example. An example of the processor is a central processing unit (CPU). The memory is constituted by a random access memory (RAM), a read only memory (ROM), and the like. The controller 50 outputs the transfer signal TX and the reset signal Pix_reset to the pixel circuit 10 to control the pixel circuit 10. The controller 50 outputs the selection signal P_sel and the selection signal N_sel to the filter circuit 21 to control the filter circuit 21. The controller 50 switches the state of the CMOS switch 25 between the low resistance state and the high resistance state, for example. Specifically, while the capacitor 26 is being charged by the output voltage Vpix, the controller 50 switches the state of the CMOS switch 25 from the low resistance state to the high resistance state.

The controller 50 outputs the reset signal Amp_reset to the amplifier circuit 22 to control the amplifier circuit 22. The controller 50 outputs the switching signal phi1 to the sample-hold circuit 23 to control the sample-hold circuit 23. The controller 50 outputs the switching signal phi2 to the sample-hold circuit 24 to control the sample-hold circuit 24. The controller 50 may be a timing generator provided inside the signal processing circuit 1.

Figure 6:
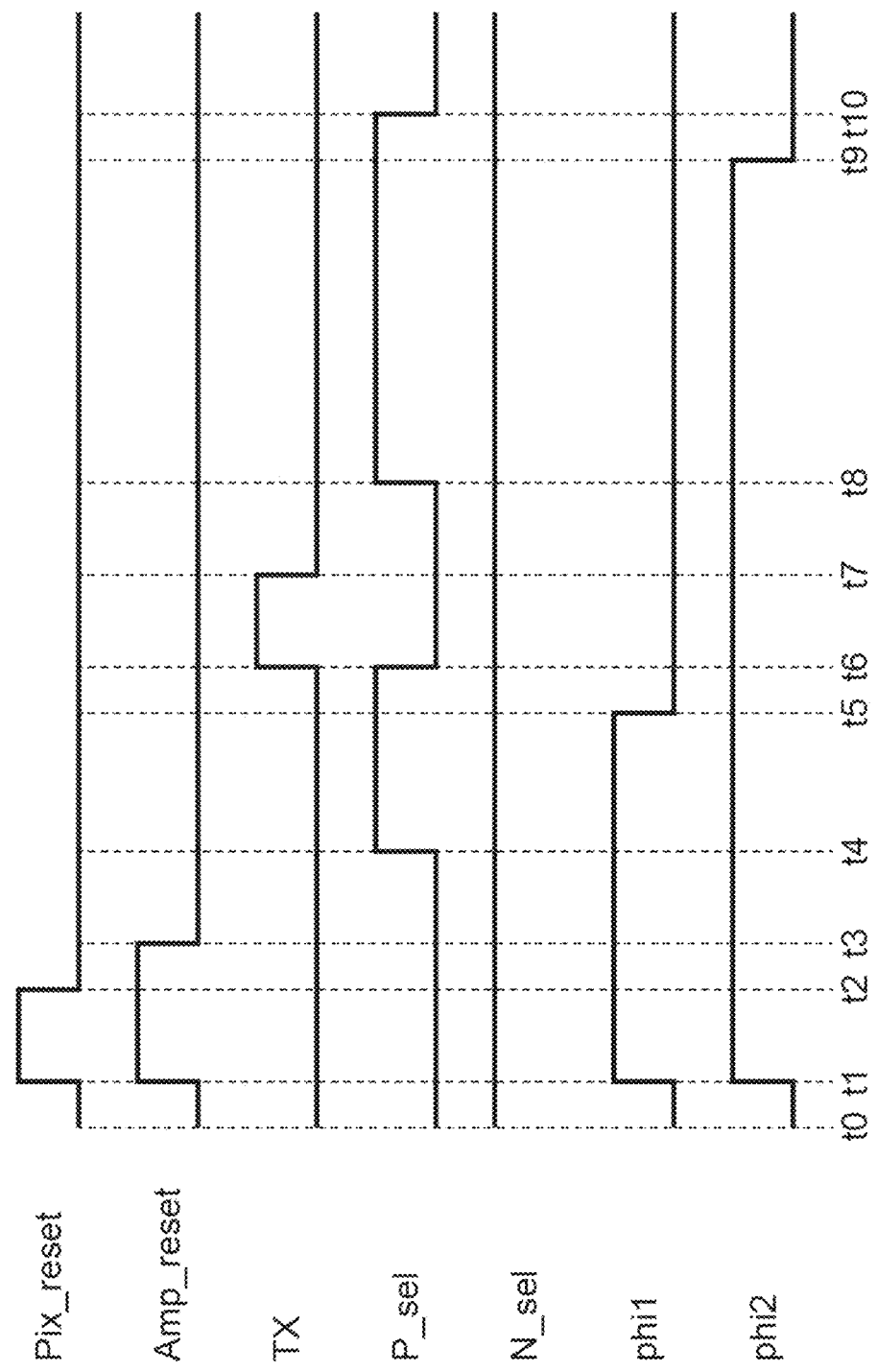
FIG. 6 is a timing chart showing a part of the operation of the signal processing circuit shown in FIG. 1.
Figure 7:
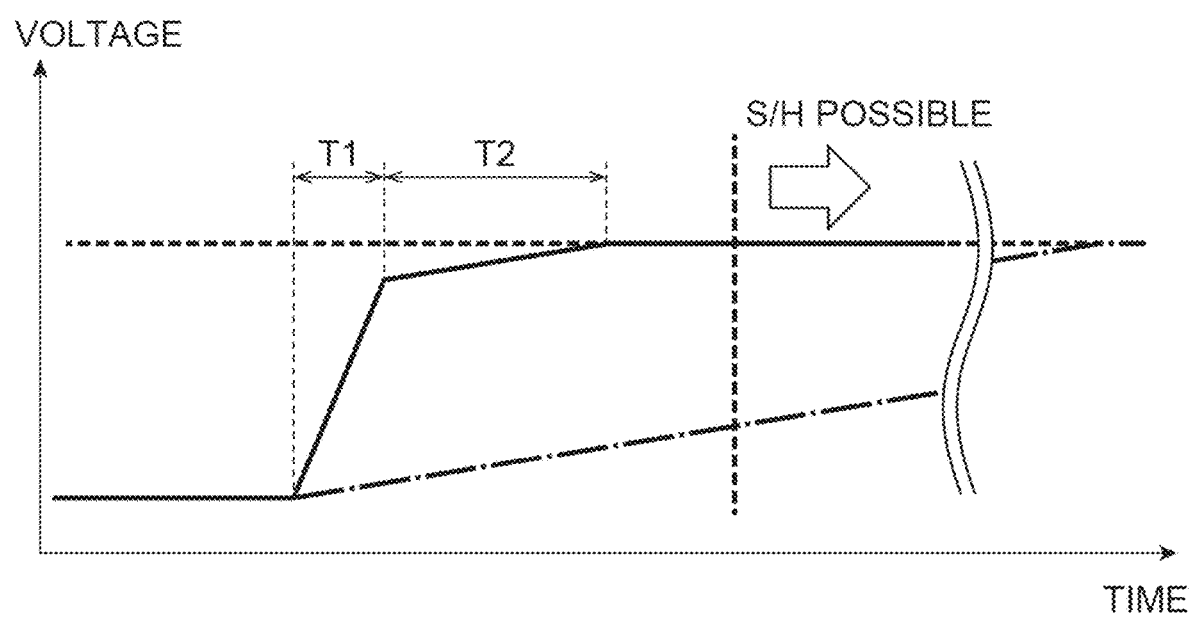
FIG. 7 is a diagram for explaining a settling time in the column circuit shown in FIG. 1.

Next, a part of a read operation performed by the signal processing circuit 1 will be described with reference to FIGS. 6 and 7. FIG. 6 is a timing chart showing a part of the operation of the signal processing circuit shown in FIG. 1. FIG. 7 is a diagram for explaining a settling time in the column circuit shown in FIG. 1. As shown in FIG. 6, the reset signal Pix_reset, the reset signal Amp_reset, the transfer signal TX, the selection signal P_sel, the switching signal phi1, and the switching signal phi2 are all set to a low level before the start of the read operation (time t0). The selection signal N_sel is set to a high level.

At time t1, when the controller 50 receives a trigger signal for starting a read operation from the outside, the controller 50 switches the reset signal Pix_reset, the reset signal Amp_reset, the switching signal phi1 and the switching signal phi2 from a low level to a high level. The state of the remaining signals is maintained. In response to the reset signal Pix_reset being switched to the high level, the transistor 15 is turned on and a reset operation of the node voltage Vfd of the node N1 is started. In response to the reset signal Amp_reset being switched to the high level, the switch 34 is turned on. As a result, both ends of the capacitor 33 are short-circuited, and the electric charge accumulated in the capacitor 33 is discharged (reset). That is, the amplifier circuit 22 is in a reset state. At this time, the potentials of the inverting input terminal, the non-inverting input terminal and the output terminal of the amplifier 31 are all set to the reference potential Vref.

Further, in response to the switching signal phi1 being switched to the high level, the switch 35 is turned on and the sample-hold circuit 23 is in a sample-capable state. Similarly, in response to the switching signal phi2 being switched to the high level, the switch 37 is turned on and the sample-hold circuit 24 is in a sample-capable state.

Subsequently, at time t2, the controller 50 switches the reset signal Pix_reset from the high level to the low level. The state of the remaining signals is maintained. In response to the reset signal Pix_reset being switched to the low level, the transistor 15 is turned off. As a result, the node voltage Vfd is set to the reset level.

The time between time t1 and time t2 is set equal to or longer than the time required for the node voltage Vfd to be set to the potential obtained by subtracting the threshold voltage Vthn from the reset potential Vr after the reset signal Pix_reset is switched to the high level, for example. In this case, the controller 50 performs processing at time t2 in response to the elapse of the above-described time from time t1. When a monitor circuit for monitoring the level of the node voltage Vfd detects that the node voltage Vfd has reached a potential obtained by subtracting the threshold voltage Vthn from the reset potential Vr, a trigger signal may be output from the monitor circuit to the controller 50. In this case, the controller 50 performs processing at time t2 in response to the reception of the trigger signal.

Subsequently, at time t3, the controller 50 switches the reset signal Amp_reset from the high level to the low level. The state of the remaining signals is maintained. In response to the reset signal Amp_reset being switched to the low level, the switch 34 is turned off and the amplifier circuit 22 is in an operating state. At this time, since the selection signal P_sel is at the low level and the selection signal N_sel is at the high level, both the transistor 27 and the transistor 28 are in an ON state. Therefore, the CMOS switch 25 is in the low resistance state. That is, the time constant of the filter circuit 21 is small, and the cut-off frequency of the filter circuit 21 is high. Therefore, as shown in the period T1 in FIG. 7, although noise such as thermal noise is not sufficiently removed from the output voltage Vpix by the filter circuit 21, the capacitor 36 and the capacitor 38 are charged at a high speed.

The time between time t2 and time t3 is set equal to or longer than the time required for the node voltage Vfd to be set to the reset level after the reset signal Pix_reset is switched to the low level, for example. If necessary, the above-mentioned time may be set in consideration of the time required for settling the fluctuation of the input/output potential of the amplifier 31 caused by the fluctuation of the node voltage Vfd. In this case, the controller 50 performs processing at time t3 in response to the elapse of the above-described time from time t2. When the monitor circuit for monitoring the level of the node voltage Vfd detects that the node voltage Vfd has reached the reset level, a trigger signal may be output from the monitor circuit to the controller 50. In this case, the controller 50 performs processing at time t3 in response to the reception of the trigger signal.

Subsequently, at time t4, the controller 50 switches the selection signal P_sel from the low level to the high level. The state of the remaining signals is maintained. In response to the selection signal P_sel being switched to the high level, the transistor 27 is turned off. Therefore, the CMOS switch 25 is brought into the high resistance state. That is, the time constant of the filter circuit 21 increases, and the cut-off frequency of the filter circuit 21 decreases. Therefore, as shown in the period T2 in FIG. 7, although noise such as thermal noise is sufficiently removed from the output voltage Vpix by the filter circuit 21, the capacitor 36 and the capacitor 38 are slowly charged.

The time between time t3 and time t4 may be set in advance based on the time constant of the filter circuit 21 when the CMOS switch 25 is in the low resistance state. In this case, the controller 50 performs processing at time t4 in response to the elapse of the above-described time from time t3. When a monitor circuit for monitoring the level of the charging voltage of the capacitor 26 detects that the charging voltage has reached a switching voltage determined in accordance with the output voltage Vpix, a trigger signal may be output from the monitor circuit to the controller 50. In this case, the switching voltage is lower than the output voltage Vpix. Another monitor circuit for monitoring the output voltage Vpix may output a trigger signal when the amplitude due to ringing of the output voltage Vpix becomes lower than an arbitrary set value. When the monitor circuit is used as described above, the controller 50 performs processing at time t4 in response to the reception of the trigger signal.

Subsequently, at time t5, the controller 50 switches the switching signal phi1 from the high level to the low level. The state of the remaining signals is maintained. In response to the switching signal phi1 being switched to the low level, the switch 35 is turned off and the charging voltage of the capacitor 36 is maintained.

The time between time t4 and time t5 may be set in advance based on the time constant of the filter circuit 21 when the CMOS switch 25 is in the high resistance state. In this case, the controller 50 performs processing at time t5 in response to the elapse of the above-described time from time t4. When a monitor circuit for monitoring the level of the charging voltage of the capacitor 26 detects that the charging voltage has reached a convergence voltage determined in accordance with the output voltage Vpix, a trigger signal may be output from the monitor circuit to the controller 50. In this case, the controller 50 performs processing at time t5 in response to the reception of the trigger signal.

Subsequently, at time t6, the controller 50 switches the selection signal P_sel from the high level to the low level and switches the transfer signal TX from the low level to the high level. The state of the remaining signals is maintained. In response to the selection signal P_sel being switched to the low level, the transistor 27 is turned on. Therefore, the CMOS switch 25 is brought into the low resistance state. Further, in response to the transfer signal TX being switched to the high level, the transistor 12 is turned on and the electric charge accumulated in the light receiving element 11 is transferred to the node N1 via the transistor 12. The time between time t5 and time t6 is set to an arbitrary time. The controller 50 performs processing at time t6 in response to the elapse of the above-described time from time t5.

Subsequently, at time t7, the controller 50 switches the transfer signal TX from the high level to the low level. The state of the remaining signals is maintained. In response to the transfer signal TX being switched to the low level, the transistor 12 is turned off. While the transfer signal TX is at the high level, all the electric charge accumulated in the light receiving element 11 are transferred to the node N1. As described above, the node voltage Vfd decreases from the reset level in accordance with the amount of electric charge. Then, the node voltage Vfd is amplified by the source follower circuit 14 to be converted into the output voltage Vpix, and the output voltage Vpix is output to the column circuit 20 via the column signal line Lc. At this time, the CMOS switch 25 is in the low resistance state. Therefore, as shown in the period T1 in FIG. 7, although noise such as thermal noise is not sufficiently removed from the output voltage Vpix by the filter circuit 21, the capacitor 38 is charged at a high speed.

The time between time t6 and time t7 is set to be equal to or longer than the time required for all electric charge accumulated in the light receiving element 11 to be transferred to the node N1 after the transfer signal TX is switched to the high level. The controller 50 performs processing at time t7 in response to the elapse of the above-described time from time t6.

Subsequently, at time t8, the controller 50 switches the selection signal P_sel from the low level to the high level. The state of the remaining signals is maintained. In response to the selection signal P_sel being switched to the high level, the transistor 27 is turned off. Therefore, the CMOS switch 25 is brought into the high resistance state. As shown in the period T2 in FIG. 7, although noise such as thermal noise is sufficiently removed from the output voltage Vpix by the filter circuit 21, the capacitor 38 is slowly charged. The trigger for the controller 50 to perform processing at time t8 is the same as the trigger for the controller 50 to perform processing at time t4.

Subsequently, at time t9, the controller 50 switches the switching signal phi2 from the high level to the low level. The state of the remaining signals is maintained. In response to the switching signal phi2 being switched to the low level, the switch 37 is turned off and the charging voltage of the capacitor 38 is maintained. The trigger for the controller 50 to perform processing at time t9 is the same as the trigger for the controller 50 to perform processing at time t5.

Subsequently, at time t10, the controller 50 switches the selection signal P_sel from the high level to the low level. The state of the remaining signals is maintained. In response to the selection signal P_sel being switched to the low level, the transistor 27 is turned on. Therefore, the CMOS switch 25 is brought into the low resistance state. The time between time t9 and time t10 is set to an arbitrary time. The controller 50 performs processing at time t10 in response to the elapse of the above-described time from time t9.

Subsequently, the charging voltage of the capacitor 36 and the charging voltage of the capacitor 38 are supplied to a circuit in the subsequent stage. Thus, a series of operations of the read processing is completed.

In the signal processing circuit 1 described above, the low-pass filter is constituted by the CMOS switch 25 and the capacitor 26. The CMOS switch 25 includes the transistor 27 and the transistor 28 connected in parallel. The transistor 27 is a p-channel MOSFET, and the transistor 28 is an n-channel MOSFET. As the input voltage of the CMOS switch 25 increases, the ON resistance value Rp of the transistor 27 tends to decrease and the ON resistance value Rn of the transistor 28 tends to increase. In the signal processing circuit 1, since the CMOS switch 25 is used in a range in which the ON resistance value Rn is higher than the ON resistance value Rp, the resistance value Rc of the CMOS switch 25 in the case where the transistor 27 is in the OFF state and the transistor 28 is in the ON state (high resistance state) is higher than the resistance value Rc of the CMOS switch 25 in the case where both the transistor 27 and the transistor 28 are in the ON state (low resistance state). Therefore, switching the time constant of the filter circuit 21 can be realized by switching the state of the CMOS switch 25 between the low resistance state and the high resistance state. As a result, since the resistor element can be omitted, the time constant of the filter circuit can be switched while reducing the circuit scale.

For example, when the cut-off frequency is set to 10 kHz, the time constant is about 16 usec. This time constant can be realized, for example, using a resistance value of 1 MΩ and a capacitance value of 16 pF. When a capacitor having a unit capacitance of 10 fF/μm$^2$ and a capacitance value of 16 pF is manufactured, the area of the capacitor is 1591.5 μm$^2$. When a resistor element having a resistance value of 1 MΩ is manufactured using a sheet resistance having a width of 1.5 μm and a resistance value of 2 kΩ, the area of the resistor element is 1125 μm$^2$. Therefore, the area of the filter circuit is 2716.5 μm$^2$. On the other hand, when the CMOS switch 25 is manufactured by a 90 nm process, the area of the CMOS switch 25 is 1.92 μm$^2$. Therefore, the area of the filter circuit 21 is 1593.5 μm$^2$. As described above, the area of the CMOS switch 25 is about 1/600 of the area of the resistor element. Although there are some differences depending on processes and conditions, the area of the CMOS switch 25 is reduced to about 1/200 to 1/600 of the area of the resistor element. Even when the areas of the entire filter circuits are compared with each other, the area of the filter circuit 21 is about 1/1.7 of the area of the filter circuit using the resistor element.

While the capacitor 26 is being charged by the output voltage Vpix, the controller 50 switches the state of the CMOS switch 25 from the low resistance state to the high resistance state. According to this configuration, while the capacitor 26 is being charged by the output voltage Vpix, the time constant of the filter circuit 21 is switched from a small value to a large value. Since the CMOS switch 25 is in the low resistance state during a period from when charging of the capacitor 26 is started by the output voltage Vpix to when the charging voltage of the capacitor 26 approaches the output voltage Vpix, the capacitor 26 is charged at a high speed. When the charging voltage of the capacitor 26 approaches the output voltage Vpix, the state of the CMOS switch 25 is switched from the low resistance state to the high resistance state, and the capacitor 26 is slowly charged while noise is removed from the output voltage Vpix. As described above, the settling time required for the charging voltage of the capacitor 26 to reach the output voltage Vpix can be reduced while removing noise from the output voltage Vpix.

In the signal processing circuit 1, the filter circuit 21 is provided between the light receiving element 11 (pixel circuit 10) and the amplifier circuit 22. The output voltage Vpix includes noise such as thermal noise caused by the source follower circuit 14. Since the noise is removed by the filter circuit 21 before being amplified by the amplifier circuit 22, the noise can be effectively removed.

As described above, the ON resistance value Rp and the ON resistance value Rn can vary in accordance with the input voltage (output voltage Vpix) of the CMOS switch 25. Therefore, by appropriately setting the reset level of the output voltage Vpix, the resistance value Rc in the low resistance state and the resistance value Rc in the high resistance state can be set to desired values.

Specifically, the setting circuit 13 sets the reset level of the output voltage Vpix so that the output voltage Vpix varies within a range in which the ON resistance value Rn is higher than the ON resistance value Rp. According to this configuration, since the magnitude relationship between the resistance value Rc in the low resistance state and the resistance value Rc in the high resistance state is determined, switching of the time constant of the filter circuit 21 can be surely realized.

The low resistance state is a state in which both the transistor 27 and the transistor 28 are in the ON state. In this case, the resistance value Rc in the low resistance state is a combined resistance value of the ON resistance value Rp and the ON resistance value Rn. Therefore, the resistance value Rc is lower than the ON resistance value Rp and the ON resistance value Rn. Therefore, it is possible to further reduce the time constant of the filter circuit 21 when the CMOS switch 25 is in the low resistance state.

Second Embodiment

Figure 8:
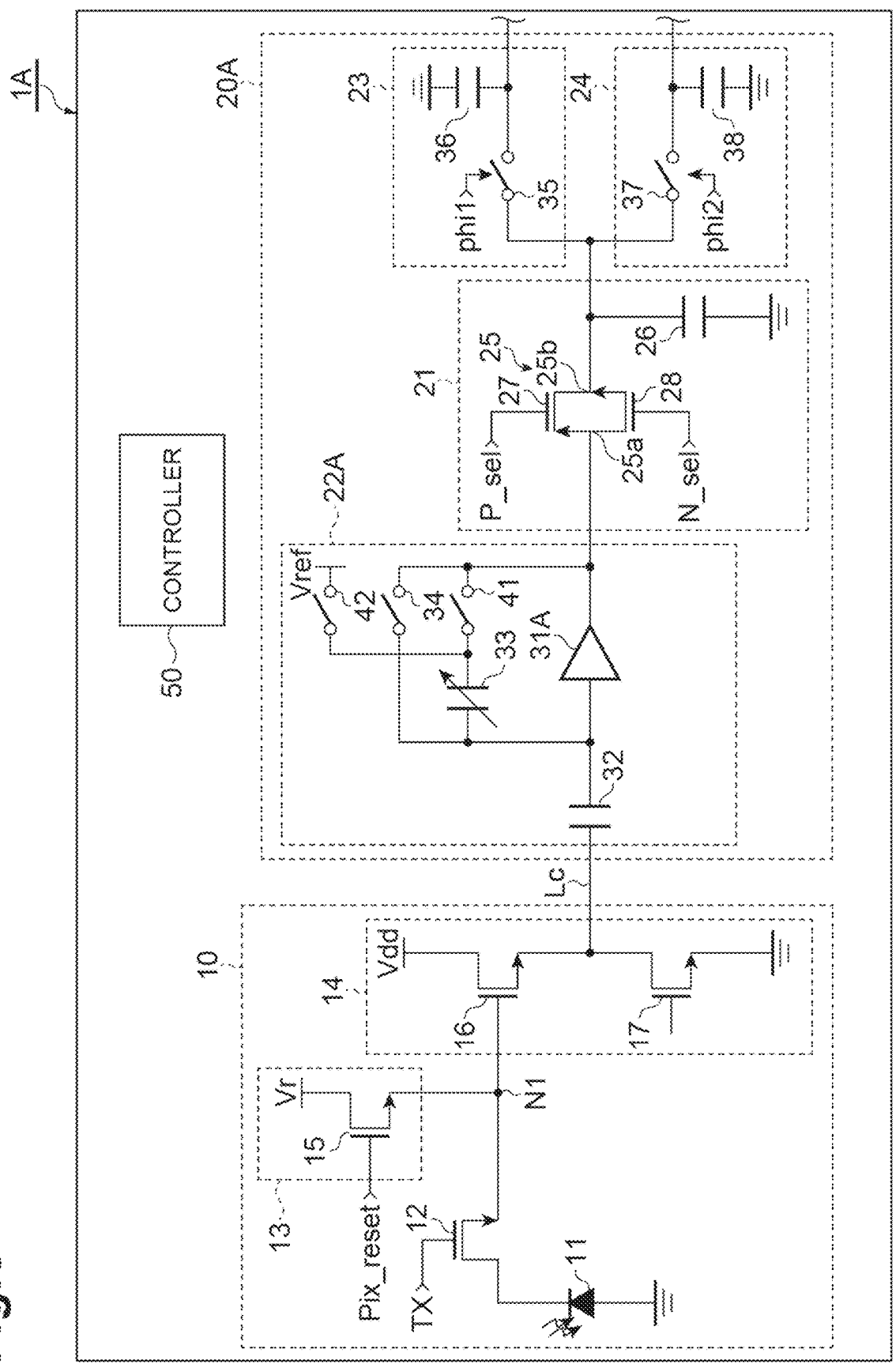
FIG. 8 is a diagram showing a circuit configuration of a signal processing circuit according to a second embodiment.

Next, a configuration of a signal processing circuit according to a second embodiment will be described with reference to FIG. 8. FIG. 8 is a diagram showing a circuit configuration of a signal processing circuit according to a second embodiment. As shown in FIG. 8, a signal processing circuit 1A is mainly different from the signal processing circuit 1 in that the signal processing circuit 1A includes a column circuit 20A in place of the column circuit 20. The column circuit 20A is mainly different from the column circuit 20 in that the column circuit 20A includes an amplifier circuit 22A in place of the amplifier circuit 22 and in the arrangement of the filter circuit 21.

The amplifier circuit 22A is mainly different from the amplifier circuit 22 in that the amplifier circuit 22A further includes a switch 41 and a switch 42, and includes the amplifier 31A in place of the amplifier 31. The amplifier 31A is a single amplifier. The switch 41 is connected in series with the capacitor 33, and a series circuit of the capacitor 33 and the switch 41 is electrically connected between an input terminal and an output terminal of the amplifier 31A. One end of the switch 42 is electrically connected to a connection point between the capacitor 33 and the switch 41. A reference potential Vref is supplied to the other end of the switch 42.

The filter circuit 21 is provided in the output stage of the amplifier circuit 22A. That is, the amplifier circuit 22A generates an output signal (target signal) by amplifying the output voltage Vpix, and supplies the output signal to the filter circuit 21. The filter circuit 21 removes noise from the output signal of the amplifier circuit 22A.

In the signal processing circuit 1A, the effects similar to those of the signal processing circuit 1 are exerted. In the signal processing circuit 1, the filter circuit 21 is provided in the output stage of the source follower circuit 14, whereas in the signal processing circuit 1A, the filter circuit 21 is provided in the output stage of the amplifier circuit 22A. Since the source follower circuit 14 is disposed in the pixel array, the circuit scale cannot be increased. Therefore, when the filter circuit 21 is driven by the source follower circuit 14 (electric current is flowed into the filter circuit 21), it is necessary to drive the filter circuit 21 by several transistors. On the other hand, since the amplifier circuit 22A is limited only by the column widths, the circuit scale can be made larger than that of the source follower circuit 14. Therefore, the amplifier circuit 22A can flow more electric current into the filter circuit 21. As a result, the capacitor 26 can be charged at a high speed to reach a target potential in a short time.

The amplifier circuit 22A has a function as a setting circuit for setting a reset level of the output signal. Specifically, first, the switches 34 and 42 are set to the ON state and the switch 41 is set to the OFF state. As a result, a potential difference obtained by subtracting the offset voltage of the amplifier 31A from the reference potential Vref is generated in the capacitor 33. Subsequently, the switch 42 is set to the ON state, and the switches 34 and 41 are set to the OFF state. As a result, the input terminal of the amplifier 31A is brought into a floating state. Subsequently, the switches 34, 41, and 42 are set to the OFF state. As a result, electric charge corresponding to the potential difference obtained by subtracting the offset voltage of the amplifier 31A from the reference potential Vref is held in the capacitor 33. Subsequently, the switch 41 is set to the ON state, and the switches 34 and 42 are set to the OFF state. As a result, the output signal of the amplifier circuit 22A (amplifier 31A) is level-shifted to the reference potential Vref. In this manner, the reset level of the output signal is set to the reference potential Vref.

As described above, the ON resistance value Rp and the ON resistance value Rn can vary in accordance with the input voltage Vin (output voltage Vpix) of the CMOS switch 25. Therefore, by appropriately setting the reset level of the output voltage Vpix, the resistance value Rc in the low resistance state and the resistance value Rc in the high resistance state can be set to desired values.

The signal processing circuit according to the present disclosure is not limited to the above-described embodiments.

For example, the column circuit 20 may include the amplifier circuit 22A in place of the amplifier circuit 22. The column circuit 20A may include the amplifier circuit 22 in place of the amplifier circuit 22A.

Since the input voltage Vin can take a value from 0 V to 3.3 V, for example, the lower limit value of the variation range of the input voltage Vin may not be higher than the voltage at which the ON resistance value Rn and the ON resistance value Rp have the same resistance value. Since the combined resistance value of the ON resistance value Rn and the ON resistance value Rp is lower than any of the ON resistance value Rn and the ON resistance value Rp, the low resistance state can be realized by setting both the transistor 27 and the transistor 28 to the ON state, and the high resistance state can be realized by setting one of the transistor 27 and the transistor 28 to the ON state and setting the other to the OFF state.

In the signal processing circuits 1 and 1A, since the CMOS switch 25 is used in a range in which the ON resistance value Rn is higher than the ON resistance value Rp, the low resistance state of the CMOS switch 25 may be realized by setting the transistor 27 to the ON state and the transistor 28 to the OFF state.

In the above embodiments, the combined resistance value of the ON resistance value Rp and the ON resistance value Rn is substantially constant regardless of the input voltage Vin, but may not be constant. In the example shown in FIG. 5, since the ON resistance value Rn when the input voltage Vin is a low voltage and the ON resistance value Rp when the input voltage Vin is a high voltage are substantially equal to each other, the combined resistance value of the ON resistance value Rp and the ON resistance value Rn is substantially constant regardless of the input voltage Vin. On the other hand, for example, the ON resistance value Rp may be set to a value lower than that of the example shown in FIG. 5. In other words, the ON resistance value Rp when the input voltage Vin is a high voltage may be set to a value lower than the ON resistance value Rn when the input voltage Vin is a low voltage. In this case, since the resistance value Rc in the low resistance state can be made lower, the settling time can be further shortened.

The signal processing circuit 1 may further include an output buffer in the output stage of the column circuit 20.

The transistor 15 may be a p-channel MOSFET. In this case, when the reset signal Pix_reset is at the low level, the transistor 15 is turned on. Therefore, a low-level pulse-like reset signal Pix_reset is used.

For example, when the input voltage Vin is known in advance, the reset level of the output voltage Vpix is set in advance in accordance with the input voltage Vin. That is, the signal processing circuit 1 may be configured in advance so that the CMOS switch 25 is used in a range in which the ON resistance value Rn is higher than the ON resistance value Rp. In this case, the pixel circuit 10 may not include the setting circuit 13.

Figure 9:
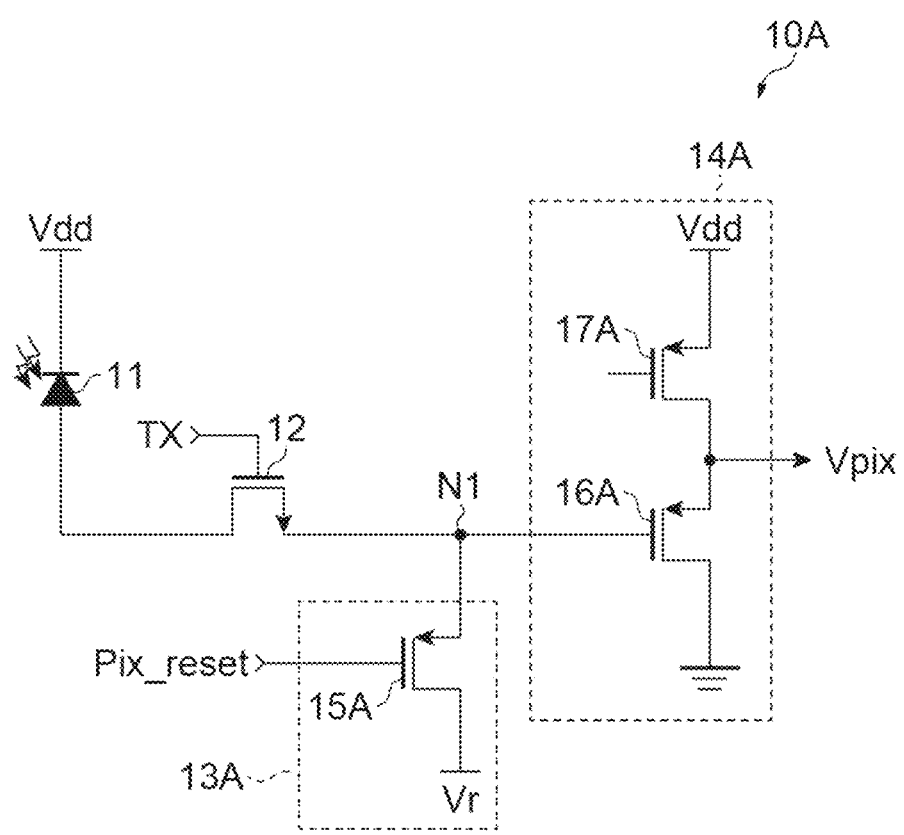
FIG. 9 is a diagram showing a modification example of a pixel circuit.
Figure 10:
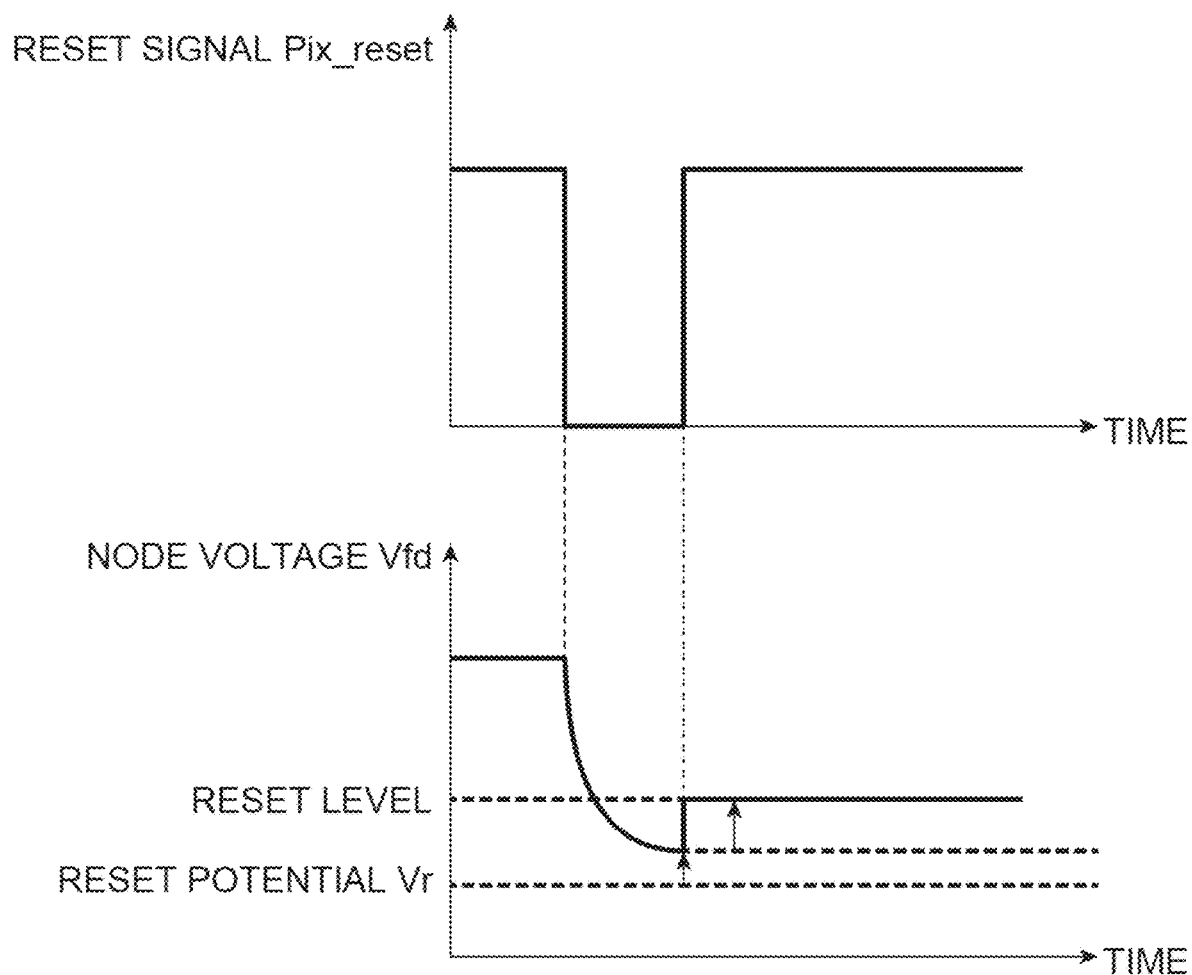
FIG. 10 is a diagram for explaining a reset level set by the setting circuit shown in FIG. 9.
Figure 11:
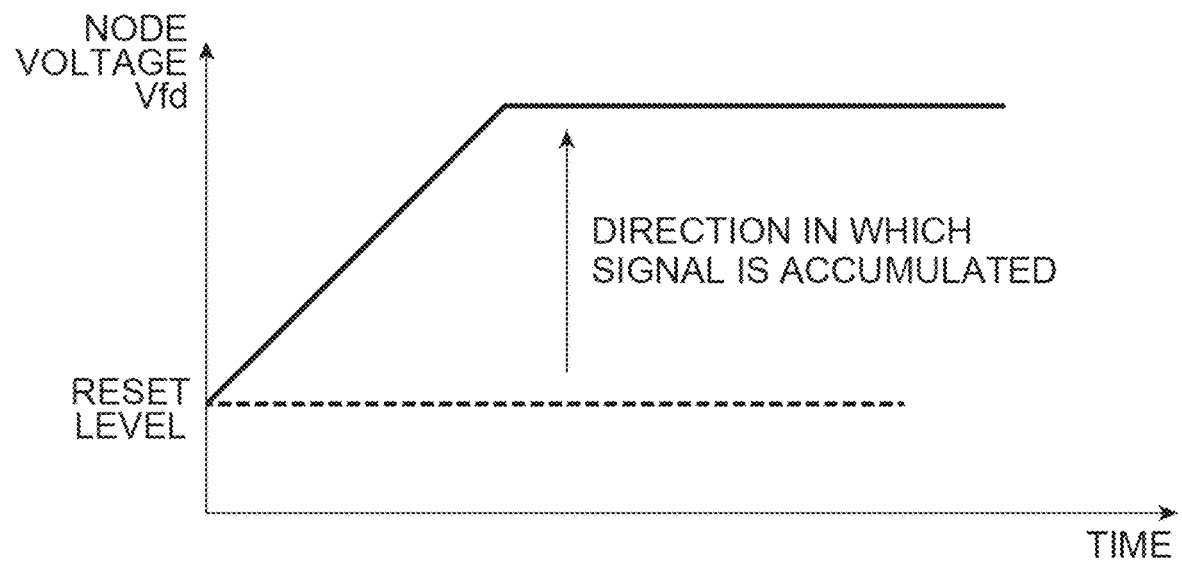
FIG. 11 is a diagram for explaining the voltage of the floating diffusion node shown in FIG. 9.
Figure 12:
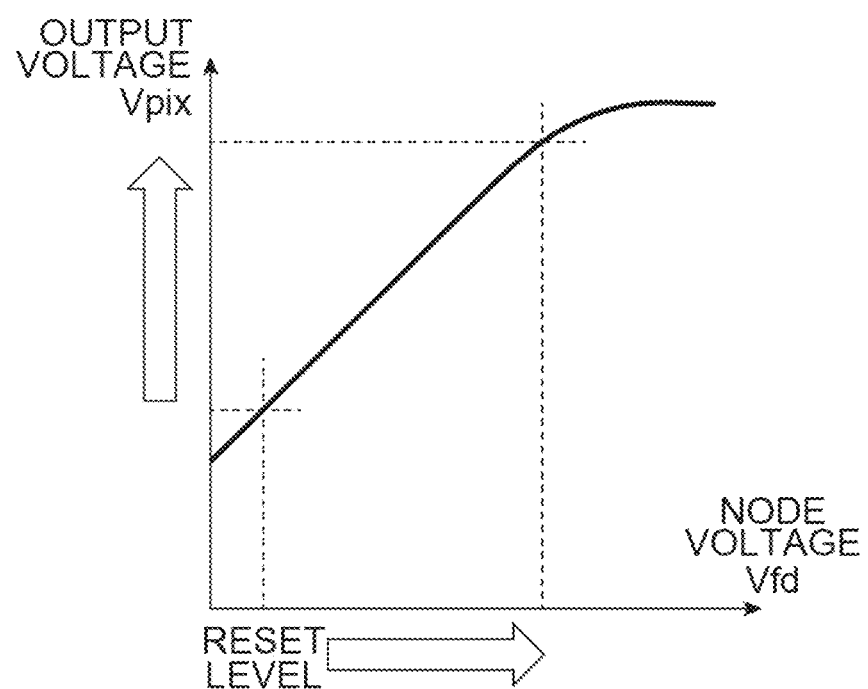
FIG. 12 is a diagram showing input/output characteristics of the source follower circuit shown in FIG. 9.

The circuit configuration of the pixel circuit 10 is not limited to the circuit configurations shown in FIGS. 1 and 8. A modification example of the pixel circuit will be described with reference to FIGS. 9 to 12. FIG. 9 is a diagram showing a modification example of a pixel circuit. FIG. 10 is a diagram for explaining a reset level set by the setting circuit shown in FIG. 9. FIG. 11 is a diagram for explaining the voltage of the floating diffusion node shown in FIG. 9. FIG. 12 is a diagram showing input/output characteristics of the source follower circuit shown in FIG. 9.

A pixel circuit 10A shown in FIG. 9 is mainly different from the pixel circuit 10 in that the pixel circuit 10A includes a setting circuit 13A in place of the setting circuit 13, the pixel circuit 10A includes a source follower circuit 14A in place of the source follower circuit 14, and the wiring of the light receiving element 11. In the pixel circuit 10A, the cathode of the light receiving element 11 is electrically connected to the power supply line for supplying the power supply voltage Vdd, and the anode of the light receiving element 11 is electrically connected to the drain of the transistor 12.

The setting circuit 13A is mainly different from the setting circuit 13 in that the setting circuit 13A includes a transistor 15A in place of the transistor 15. The transistor 15A is a p-channel MOSFET. A drain of the transistor 15A is set to the reset potential Vr. A source of the transistor 15A is electrically connected to the node N1. The reset signal Pix_reset is supplied to a gate of the transistor 15A. By supplying a low-level pulse-like reset signal Pix_reset to the gate of the transistor 15A, the reset operation of the node voltage Vfd is performed while the reset signal Pix_reset is at the low level (reset period). In the reset operation, the transistor 15A is turned on and the node voltage Vfd is set to the reset level.

As shown in FIG. 10, the reset level of the node voltage Vfd is higher than the reset potential Vr. More specifically, when the transistor 15A is turned on, the source voltage (i.e., the node voltage Vfd) of the transistor 15A decreases, so that the source-gate voltage Vsg of the transistor 15A decreases. Then, before the source-drain voltage Vsd of the transistor 15A becomes 0, the source-gate voltage Vsg of the transistor 15A becomes lower than the threshold voltage Vthp of the transistor 15A. Therefore, the reset current (=β×(Vsg−Vthp)×Vsd) becomes 0.

That is, the fluctuation of the node voltage Vfd is stopped before the source voltage of the transistor 15A becomes equal to the drain voltage (i.e., the reset potential Vr) of the transistor 15A. As a result, the node voltage Vfd changes to a potential obtained by adding the threshold voltage Vthp to the reset potential Vr during the reset period. Further, when the reset period ends and the transistor 15A is switched from the ON state to the OFF state, the node voltage Vfd is further increased by the influence of the clock feed-through component and the charge-injection. As described above, the node voltage Vfd is set to the reset level.

As shown in FIG. 11, when the transistor 12 is in the ON state, the node voltage Vfd increases from the reset level as the amount of accumulated electric charge increases.

The source follower circuit 14A is mainly different from the source follower circuit 14 in that the source follower circuit 14A includes transistors 16A and 17A in place of the transistors 16 and 17. The transistors 16A and 17A are, for example, p-channel type MOSFETs. A drain of the transistor 16A is electrically connected to the ground potential. A gate of the transistor 16A is electrically connected to the node N1. A source of the transistor 16A and a drain of the transistor 17A are electrically connected to each other and electrically connected to the column signal line Lc. A source of the transistor 17A is electrically connected to the power supply line for supplying the power supply voltage Vdd. A bias voltage is supplied to a gate of the transistor 17A. The transistor 17A functions as a load transistor. The node voltage Vfd supplied to the gate of the transistor 16A is amplified, and the output voltage Vpix is output from the source of the transistor 16A to the column signal line Lc.

The source follower circuit 14A has the input/output characteristics shown in FIG. 12. In FIG. 12, the horizontal axis represents an input voltage (node voltage Vfd), and the vertical axis represents an output voltage Vpix. The node voltage Vfd is input as an input voltage to the source follower circuit 14A. As described above, the node voltage Vfd increases from the reset level in accordance with the amount of accumulated electric charge. In a range in which the node voltage Vfd varies, the input voltage and the output voltage of the source follower circuit 14A are directly proportional to each other. In other words, the output voltage Vpix is obtained by multiplying the node voltage Vfd by a predetermined amplification factor. As the node voltage Vfd increases, the output voltage Vpix also increases. In other words, the output voltage Vpix is a signal corresponding to the electric charge accumulated by the light receiving element 11.

The upper limit value of the variation range of the input voltage Vin of the CMOS switch 25 provided in the subsequent stage is lower than a voltage (about 1.7 V in the example shown in FIG. 5) at which the ON resistance value Rn and the ON resistance value Rp have the same resistance value. In the variation range, the ON resistance value Rp is higher than the ON resistance value Rn, and the combined resistance value of the ON resistance value Rp and the ON resistance value Rn is lower than each of the ON resistance value Rp and the ON resistance value Rn. Therefore, the low resistance state is realized by setting both the transistor 27 (second MOSFET) and the transistor 28 (first MOSFET) to the ON state. The high resistance state is realized by setting the transistor 27 to the ON state and the transistor 28 to the OFF state. The reset potential Vr is set so that the variation range of the input voltage Vin is the same as the above-described range. In other words, the setting circuit 13A sets the reset level of the output voltage Vpix so that the output voltage Vpix varies within a range in which the ON resistance value Rp is higher than the ON resistance value Rn.

Also in this configuration, the upper limit value of the variation range of the input voltage Vin does not have to be lower than the voltage at which the ON resistance value Rn and the ON resistance value Rp have the same resistance value. Since the combined resistance value of the ON resistance value Rn and the ON resistance value Rp is lower than any of the ON resistance value Rn and the ON resistance value Rp, the low resistance state can be realized by setting both the transistor 27 and the transistor 28 to the ON state, and the high resistance state can be realized by setting one of the transistor 27 and the transistor 28 to the ON state and setting the other to the OFF state.

The pixel circuit 10A may further include a row selection transistor provided between the source of the transistor 16A and the column signal line Lc.

In signal processing circuits 1 and 1A including the pixel circuit 10A, since the CMOS switch 25 is used in a range in which the ON resistance value Rp is higher than the ON resistance value Rn, the resistance value Rc in the case where the transistor 27 is in the ON state and the transistor 28 is in the OFF state (high resistance state) is higher than the resistance value Rc in the case where both the transistor 27 and the transistor 28 are in the ON state (low resistance state). Therefore, when the input voltage Vin of the CMOS switch 25 is a low voltage, switching of the time constant of the filter circuit 21 can be realized more reliably.

Figure 13:
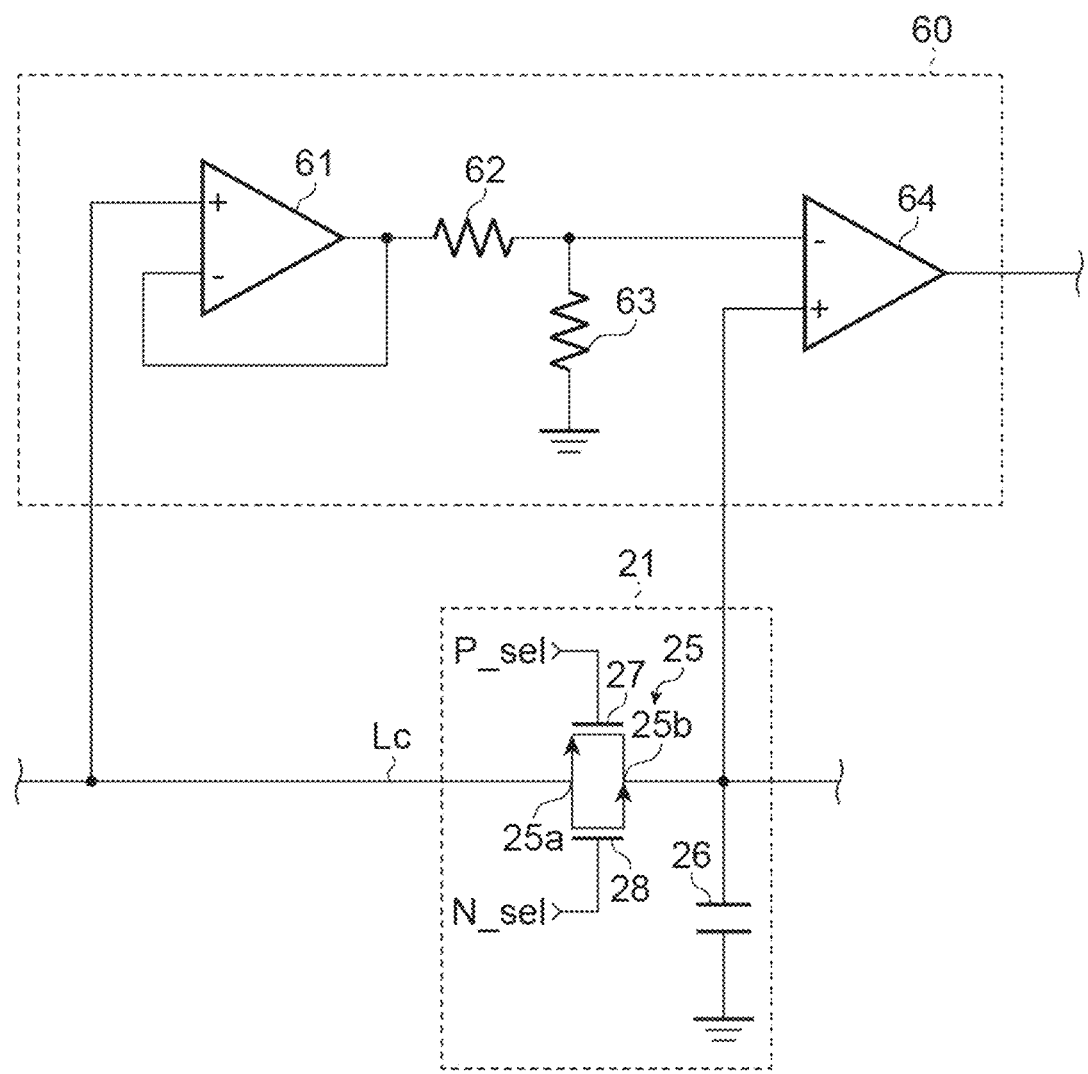
FIG. 13 is a diagram showing an example of a circuit configuration of a monitor circuit.

Any circuit can be used as a monitor circuit for monitoring the level of the node voltage Vfd and the level of the charging voltage of the capacitor 26. FIG. 13 is a diagram showing an example of a circuit configuration of a monitor circuit. A monitor circuit 60 shown in FIG. 13 is a circuit for monitoring the level of the charging voltage of the capacitor 26. The monitor circuit 60 includes an amplifier 61, a resistor element 62, a resistor element 63, and a comparator 64.

The amplifier 61 has an inverting input terminal, a non-inverting input terminal and an output terminal. The non-inverting input terminal of the amplifier 61 is electrically connected to the column signal line Lc. The inverting input terminal of the amplifier 61 is electrically connected to the output terminal of the amplifier 61. That is, the amplifier 61 constitutes a voltage follower circuit, and receives the output voltage Vpix and outputs the output voltage Vpix. One end of the resistor element 62 is electrically connected to the output terminal of the amplifier 61, and the other end of the resistor element 62 is electrically connected to one end of the resistor element 63 and an inverting input terminal of the comparator 64. The other end of the resistor element 63 is electrically connected to the ground potential. The resistor elements 62 and 63 constitutes a resistance voltage divider circuit. The output voltage Vpix is divided by the resistance value of the resistor element 62 and the resistance value of the resistor element 63, and a switching voltage which is several percent lower than the output voltage Vpix is supplied to the inverting input terminal of the comparator 64.

A non-inverting input terminal of the comparator 64 is electrically connected to one end of the capacitor 26. The charging voltage of the capacitor 26 is supplied to the non-inverting input terminal of the comparator 64. An output terminal of the comparator 64 is electrically connected to the controller 50. While the charging voltage is lower than the switching voltage, the comparator 64 outputs a low-level trigger signal. When the charging voltage exceeds the switching voltage, the comparator 64 outputs a high-level trigger signal. When the controller 50 receives the high-level trigger signal from the comparator 64, the controller 50 switches the selection signal P_sel from the low level to the high level (see time t4 and time t8 in FIG. 6).

REFERENCE SIGNS LIST

1, 1A: signal processing circuit, 10, 10A: pixel circuit, 11: light receiving element, 12: transistor, 13, 13A: setting circuit, 14, 14A: source follower circuit, 15, 15A: transistor, 16, 16A: transistor, 17, 17A: transistor, 20, 20A: column circuit, 21: filter circuit, 22, 22A: amplifier circuit, 23: sample-hold circuit, 24: sample-hold circuit, 25: CMOS switch, 25a: terminal, 25b: terminal, 26: capacitor, 27: transistor, 28: transistor, 31: amplifier, 32: capacitor, 33: capacitor, 34: switch, 35: switch, 36: capacitor, 37: switch, 38: capacitor, 41: switch, 42: switch, 50: controller, Lc: column signal line, N1: node.

The invention claimed is:

1. A signal processing circuit comprising:
a filter circuit configured to remove noise from a target signal; and
a controller configured to control the filter circuit,
wherein the filter circuit comprises:
a CMOS switch including a first MOSFET and a second MOSFET having different channel types and connected in parallel; and
a capacitor electrically connected between an output of the CMOS switch and a ground potential,
wherein the controller switches a state of the CMOS switch between a first state in which the first MOSFET is in an ON state and a second state in which the first MOSFET is in an OFF state and the second MOSFET is in an ON state, and
wherein an ON resistance value of the second MOSFET is higher than an ON resistance value of the first MOSFET.

2. The signal processing circuit according to claim 1,
wherein the controller switches the state of the CMOS switch from the first state to the second state while the capacitor is being charged by the target signal.

3. The signal processing circuit according to claim 1, further comprising:
a light receiving element configured to generate and accumulate electric charge by being irradiated with light; and
an amplifier circuit configured to amplify an output signal of the filter circuit,
wherein the filter circuit receives, as the target signal, a signal corresponding to the electric charge accumulated by the light receiving element.

4. The signal processing circuit according to claim 1, further comprising:
a light receiving element configured to generate and accumulate electric charge by being irradiated with light; and
an amplifier circuit configured to generate the target signal by amplifying a signal corresponding to the electric charge accumulated by the light receiving element, and supply the target signal to the filter circuit.

5. The signal processing circuit according to claim 4,
wherein the amplifier circuit comprises a setting circuit configured to set a reset level of the target signal.

6. The signal processing circuit according to claim 5,
wherein the setting circuit sets the reset level so that a voltage of the target signal varies within a range in which the ON resistance value of the second MOSFET is higher than the ON resistance value of the first MOSFET.

7. The signal processing circuit according to claim 1, further comprising a setting circuit configured to set a reset level of the target signal.

8. The signal processing circuit according to claim 1,
wherein the first state is a state in which both the first MOSFET and the second MOSFET are in an ON state.

9. The signal processing circuit according to claim 1,
wherein the first MOSFET is a p-channel MOSFET, and the second MOSFET is an n-channel MOSFET.

10. The signal processing circuit according to claim 1, wherein the first MOSFET is an n-channel MOSFET, and the second MOSFET is a p-channel MOSFET.

* * * * *